(12) United States Patent
Chen et al.

(10) Patent No.: US 8,716,763 B2
(45) Date of Patent: May 6, 2014

(54) SEMICONDUCTOR STRUCTURE AND METHOD FOR FORMING THE SAME

(75) Inventors: Li-Fan Chen, Hsinchu (TW);
Wing-Chor Chan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 222 days.

(21) Appl. No.: 13/277,653

(22) Filed: Oct. 20, 2011

(65) Prior Publication Data
US 2013/0099293 A1   Apr. 25, 2013

(51) Int. Cl.
*H01L 29/66* (2006.01)

(52) U.S. Cl.
USPC ............... 257/260; 257/548; 257/E21.421; 257/E29.265; 438/186

(58) Field of Classification Search
None
See application file for complete search history.

(56) References Cited

U.S. PATENT DOCUMENTS

| | | | |
|---|---|---|---|
| 6,087,232 | A | 7/2000 | Kim et al. |
| 7,417,270 | B2 | 8/2008 | Hower et al. |
| 2002/0098637 | A1 | 7/2002 | Hossain et al. |
| 2010/0032758 | A1* | 2/2010 | Wang et al. ............... 257/343 |

FOREIGN PATENT DOCUMENTS

| | | |
|---|---|---|
| TW | 201011913 | 3/2010 |
| TW | 201021132 | 6/2010 |

OTHER PUBLICATIONS

English language translation of abstract of TW 201011913 (published Mar. 16, 2010).
English language translation of abstract of TW 201021132 (published Jun. 1, 2010).

* cited by examiner

*Primary Examiner* — Sonya D McCall Shepard
(74) *Attorney, Agent, or Firm* — McClure, Qualey & Rodack, LLP

(57) ABSTRACT

A semiconductor structure and a method for forming the same are provided. The semiconductor structure includes a first doped region and a semiconductor region. The first doped region has a first type conductivity. The semiconductor region is in the first doped region. A source electrode and a drain electrode are respectively electrically connected to parts of the first doped region on opposite sides of the semiconductor region.

20 Claims, 6 Drawing Sheets

US 8,716,763 B2

SEMICONDUCTOR STRUCTURE AND METHOD FOR FORMING THE SAME

BACKGROUND

1. Technical Field

The disclosure relates in general to a semiconductor structure and a method for forming the same, and more particularly to a transistor and a method for forming the same.

2. Description of the Related Art

In recent years, green power technique has attracted attention. It is developed with a trend towards high conversion efficiency and low standby power consumption. A HV process has been widely used for a power supply such as a switch mode power supply. A switch mode power IC is formed by integrating a start-up circuit and a PWM circuit. A conventional start-up circuit for a HV device uses a resistor for providing a charging current to a charging capacitor until a voltage on the capacitor is achieved to a starting voltage of the PWM circuit. Then, the start-up circuit stops working. However, after stopping working, the resistor of the start-up circuit still dissipate powers. Therefore, power saving effect of the device is not good. In some techniques, the start-up circuit uses a transistor replacing the resistor. However, limited by electrical characteristics of the transistor, the transistor would have a high leakage current (higher than 100 μA) as the start-up circuit is in a stopping condition and a threshold voltage higher than 4V.

SUMMARY

A semiconductor structure is provided. The semiconductor structure comprises a first doped region and a semiconductor region. The first doped region has a first type conductivity. The semiconductor region is in the first doped region. A source electrode and a drain electrode are respectively electrically connected to parts of the first doped region on opposite sides of the semiconductor region.

A semiconductor structure is provided. The semiconductor structure comprises a first doped region, a second doped region, and a third doped region. The first doped region comprises a doped buried region having a lower-dopant-concentration region and higher-dopant-concentration regions. The lower-dopant-concentration region is adjacent between the higher-dopant-concentration regions. The lower-dopant-concentration region and the higher-dopant-concentration regions have a first type conductivity. The second doped region has a second type conductivity opposite to the first type conductivity. The third doped region has the second type conductivity. The lower-dopant-concentration region is adjacent between the second doped region and the third doped region.

A method for forming a semiconductor structure is provided. The method comprises following steps. Doped structures are formed on a substrate. The doped structures are separated from each other by a space portion. The doped structures have a first type conductivity. The substrate has a second type conductivity opposite to the first type conductivity. A first doped well and a second doped well are formed on the doped structures. The first doped well has the first type conductivity. The second doped well has the second type conductivity. An annealing step is performed for diffusing the doped structures toward the space portion to form a continuous doped buried region. The doped buried region has a lower-dopant-concentration region and higher-dopant-concentration regions. A range of the lower-dopant-concentration region corresponds to a range of the space portion, and a range of the higher-dopant-concentration regions corresponds to a range of the doped structures.

DETAILED DESCRIPTION

FIG. 1 to FIG. 7 illustrate a process for forming a semiconductor structure according to one embodiment.

Figure 1:
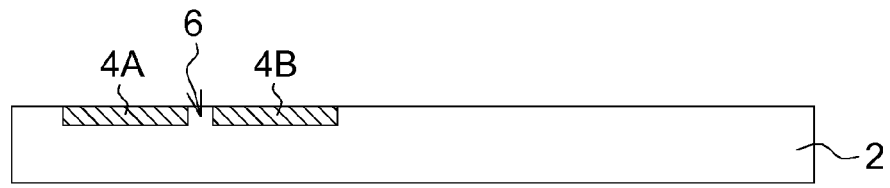
FIG. 1 to FIG. 7 illustrate a process for forming a semiconductor structure according to one embodiment.

Referring to FIG. 1, doped structures 4A, 4B are formed on a substrate 2 by an ion implantation step. The doped structures 4A, 4B are separated from each other by a space portion 6. Herein, in the ion implantation step, a region not to be doped is coved by a patterned mask layer, and a region exposed by the patterned mask layer is doped with dopant ions. Similar concepts for the ion implantation step will not be described in detail later. In embodiments, the doped structures 4A, 4B have a first type conductivity, such as N-type conductivity. The substrate 2 comprises a doped material. In addition, the substrate 2 has a second type conductivity opposite to the first type conductivity, such as P-type conductivity. The substrate 2 may comprise a SOI.

Figure 2:
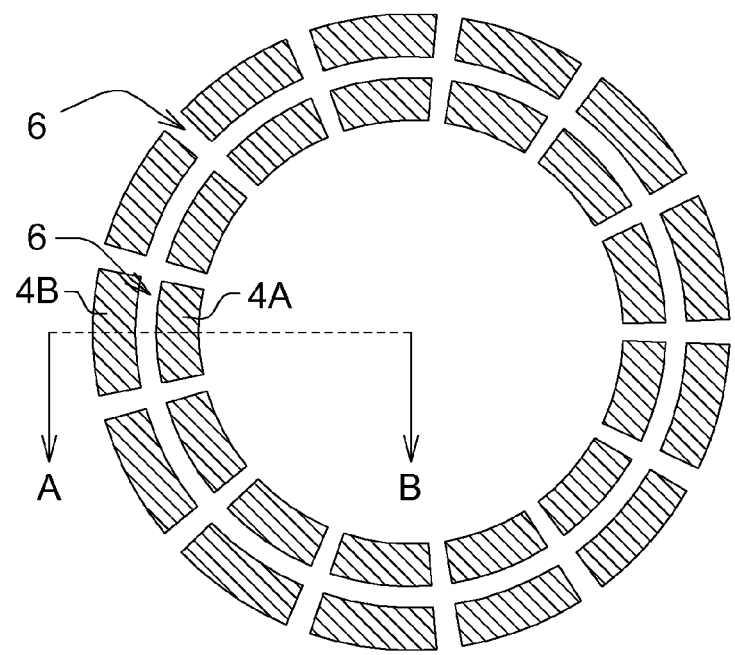

FIG. 2 illustrates a top view of the doped structures 4A, 4B as shown in FIG. 1. FIG. 1 is drawn along AB line in FIG. 2. As shown in FIG. 2, the doped structures 4A, 4B are arranged in a ring design.

Figure 3:
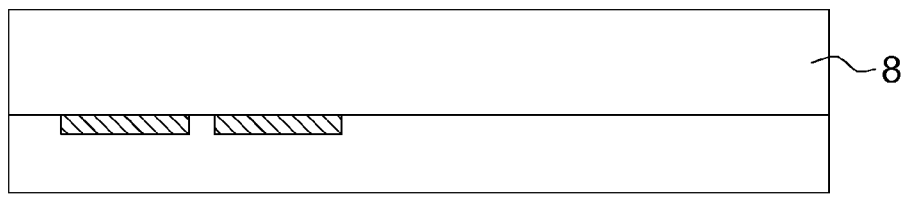

Referring to FIG. 3, a first doped well 8 is formed on the doped structures 4A, 4B. The first doped well 8 has the first type conductivity such as N-type conductivity. The first doped well 8 may be formed by an epitaxial method, or a non-epitaxial method such as a deposition method. A vapor method may be used Referring to FIG. 4, a second doped well 10 and a second doped well 18 are formed in the first doped well 8. The second doped well 10 and the second doped well 18 have the second type conductivity such as P-type conductivity. In embodiments, the second doped well 10 and the second doped well 18 are formed simultaneously.

The first doped well 8, the second doped well 10 and the second doped well 18 are not limited to a step sequence as shown in FIG. 2 and FIG. 3. In other embodiments, for example, a doped layer (not shown) having the second type conductivity such as P-type conductivity is formed on the doped structures 4A, 4B by an epitaxial method. Then, the first doped well 8 is formed in the doped layer by another doping step. The doped layer is separated into the second doped well 10 and the second doped well 18 by the first doped well 8.

Figure 4:
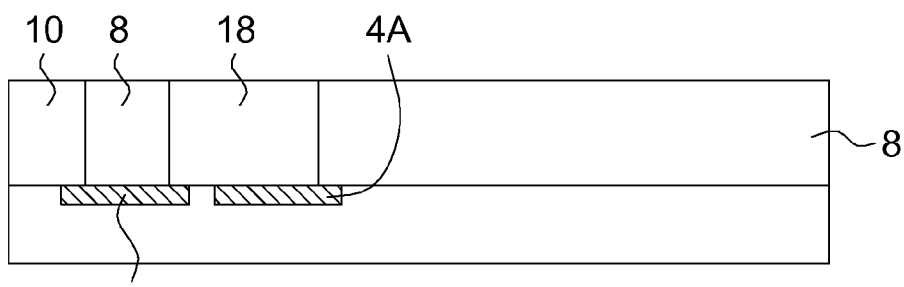
Figure 5:
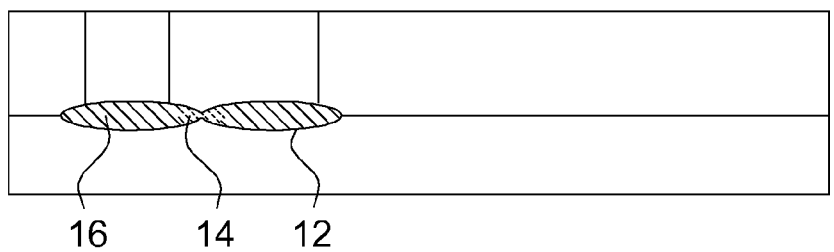

An annealing step is performed for diffusing the doped structures 4A, 4B as shown in FIG. 4 toward the space portion 6 to form a continuous doped buried region 12 as shown in FIG. 5. The doped buried region 12 has a lower-dopant-concentration region 14 and higher-dopant-concentration regions 16. A dopant concentration of the lower-dopant-concentration region 14 is smaller than a dopant concentration of the higher-dopant-concentration region 16. A range of the lower-dopant-concentration region 14 corresponds to a range of the space portion 6. A range of the higher-dopant-concentration regions 16 correspond to a range of the doped structures 4A, 4B. The annealing step for diffusing the doped structures 4A, 4B is not limited to the executing time described in this embodiment. In other embodiments, the annealing step may be performed in other later steps.

Figure 6:
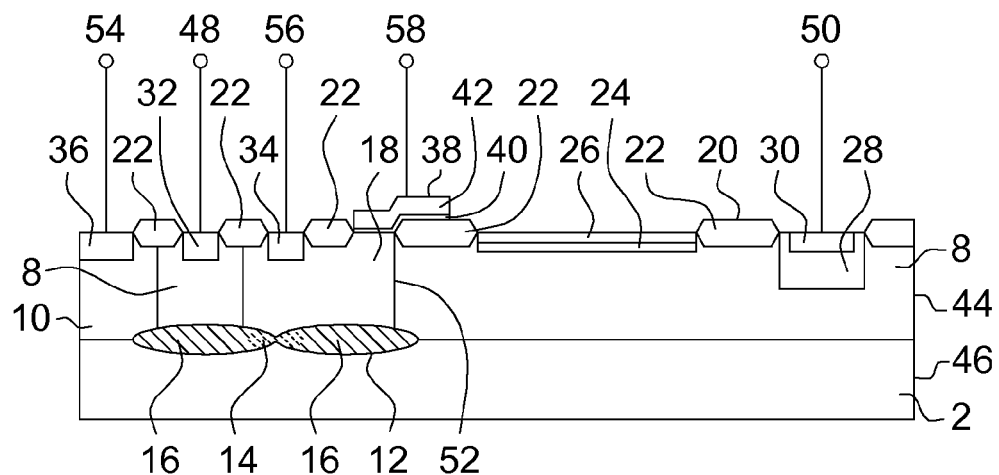

Referring to FIG. 6, a dielectric structure 20 is formed on the first doped well 8, the second doped well 10 and the second doped well 18. The dielectric structure 20 comprises dielectric portions 22 separated from each other. The dielectric portions 22 are not limited to a FOX as shown in FIG. 6. In other embodiments, the dielectric portions 22 may be a STI. The dielectric portions 22 may comprise an oxide or a nitride, such as silicon oxide.

A first top doped layer 24 is formed in a part of the first doped well 8 between the dielectric portions 22 by a doping step. A second top doped layer 26 is formed on the first top doped layer 24 by a doping step. The first top doped layer 24 and the second top doped layer 26 have opposite type conductivities. In one embodiment, the first top doped layer 24 has the first type conductivity, and the second top doped layer 26 has the second type conductivity. In another embodiment, the first top doped layer 24 has the second type conductivity, and the second top doped layer 26 has the first type conductivity. For example, the first type conductivity is N-type conductivity, and the second type conductivity is P-type conductivity.

Referring to FIG. 6, a well region 28 is formed in the first doped well 8 by a doping step. The well region 28 has the first type conductivity such as N-type conductivity. A heavily doped region 30 is formed in the well region 28 by a doping step. A heavily doped region 32 is formed in the first doped well 8 by a doping step. The heavily doped region 30 and the heavily doped region 32 have the first type conductivity such as N-type conductivity. The heavily doped region 30 and the heavily doped region 32 may be formed simultaneously. A heavily doped region 34 is formed in the second doped well 18 by a doping step. A heavily doped region 36 is formed in the second doped well 10 by a doping step. The heavily doped region 34 and the heavily doped region 36 have the second type conductivity such as P-type conductivity. The heavily doped region 34 and the heavily doped region 36 may be formed simultaneously.

A field plate structure 38 is formed on the second doped well 18. The field plate structure 38 comprises a dielectric layer 40 and an electrode layer 42 on the electrode layer 42. In embodiments, the electrode layer 42 comprises a metal, a polysilicon, a silicide, or other suitable materials. The dielectric layer 40 may comprise a nitride or an oxide such as silicon oxide.

Referring to FIG. 6, the first doped well 8, the doped buried region 12, the well region 28, the heavily doped region 30 and the heavily doped region 32 form a first doped region 44. In other words, the first doped region 44 may comprise the first doped well 8, the doped buried region 12, the well region 28, the heavily doped region 30 and the heavily doped region 32. In this embodiment, a semiconductor region 52 is a second doped region, and comprises the second doped well 18 and the heavily doped region 34. The substrate 2, the second doped well 10 and the heavily doped region 36 form a third doped region 46. In other words, the third doped region 46 may comprise the substrate 2, the second doped well 10 and the heavily doped region 36.

A source electrode 48 and a drain electrode 50 are respectively electrically connected to the heavily doped region 32 and the heavily doped region 30 of the first doped region 44 on opposite sides of the second doped well 18. A base electrode 54 is electrically connected to the heavily doped region 36 of the third doped region 46. A gate electrode 56 is electrically connected to the heavily doped region 34 of the semiconductor region 52. An electrode 58 is electrically connected to the electrode layer 42 of the field plate structure 38. In one embodiment, a bias of the electrode 58 is substantially equal to a bias of the gate electrode 56.

In this embodiment, the semiconductor structure is a JFET, such as NJFET.

In embodiments, the dielectric structure 20 is disposed adjacent to the drain electrode 50 of the semiconductor structure. The dielectric structure 20 has the dielectric portions 22 separated from each other. In addition, the semiconductor structure has the first top doped layer 24 and the second top doped layer 26 of reduced surface field (RESURF) (particularly double RESURF) concept between the dielectric portions 22. It increases a drain breakdown voltage of the semiconductor structure such as a JFET. In one embodiment, the semiconductor structure may be applied for a HV device.

Figure 10:
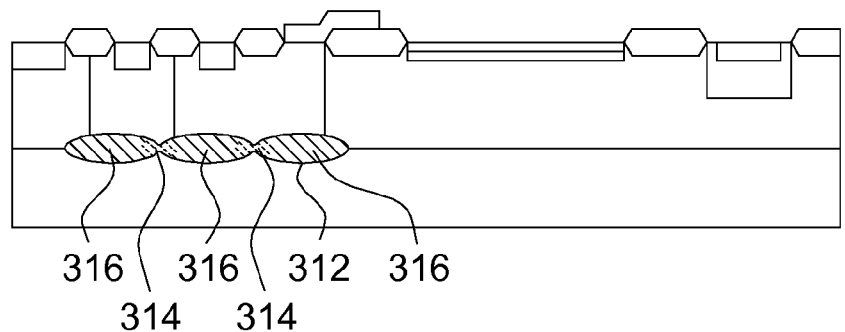
FIG. 10 illustrates a cross-section view of a semiconductor structure according to one embodiment.

The semiconductor structure such as a JFET has a channel comprising the lower-dopant-concentration region 14 of the doped buried region 12 between the semiconductor region 52 and the third doped region 46. The dopant concentration of the lower-dopant-concentration region 14 is smaller than the dopant concentration of the higher-dopant-concentration regions 16. Therefore, during turning off the semiconductor structure, depletion degree and depletion rate of the lower-dopant-concentration region 14 are higher than that of the higher-dopant-concentration regions 16. Thus, the channel can be pinched off fast and completely. In embodiments, a pinching voltage of the semiconductor structure can be adjusted by properly varying arrangement of the lower-dopant-concentration region 14, the higher-dopant-concentration regions 16 and the space portion 6 (FIG. 1). For example, the higher-dopant-concentration regions 16 are not limited to two-roll design. The higher-dopant-concentration regions 16 may be arranged by other suitable designs, such as three-roll design as shown in FIG. 10. The doped buried region 12 may be designed to have an un-uniform arrangement. In embodiments, the field plate structure 38, and the wide lower-dopant-concentration region 14 (or the space portion 6) can improve a pinching characteristic of the semiconductor structure. For example, the semiconductor structure has a sharp electric wave form. In embodiments, the on-state semiconductor structure has a constant current.

In embodiments, the semiconductor structure can be manufactured by a standard HV process, and therefore the semiconductor structure can be formed with other devices such as a MOS, a resistor, etc. at the same time. It helps to integrate various devices into a single chip and increase integration of a circuit. In addition, the cost and the processes for manufacture are reduced.

Figure 7:
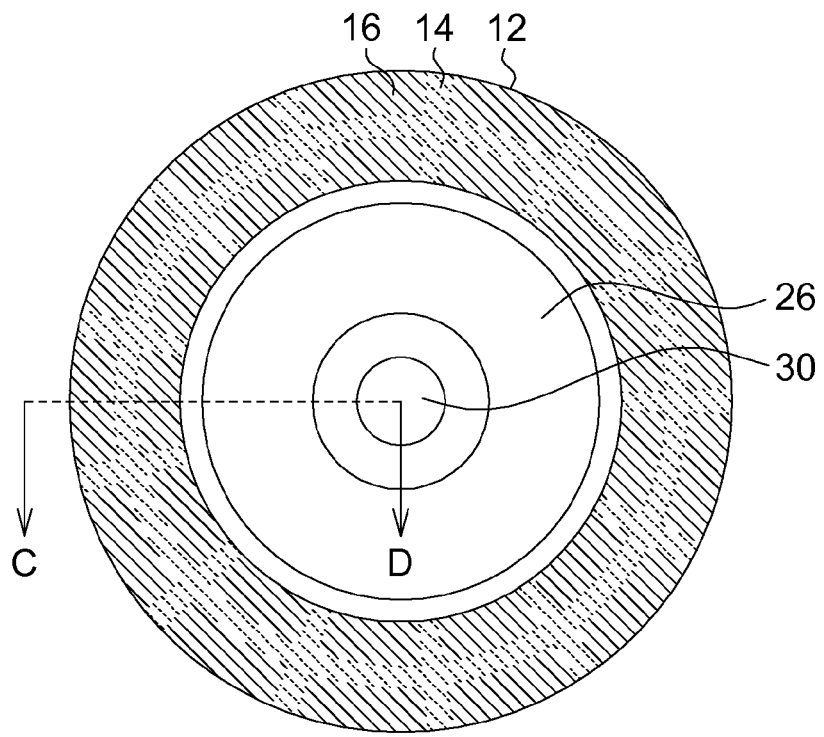

FIG. 7 illustrates a top view of the semiconductor structure as shown in FIG. 6. FIG. 6 is drawn along CD line in FIG. 7. FIG. 7 only shows the second top doped layer 26, the heavily doped region 30, and the lower-dopant-concentration region 14 and the higher-dopant-concentration regions 16 of the doped buried region 12 of the semiconductor structure as shown in FIG. 6.

Figure 8:
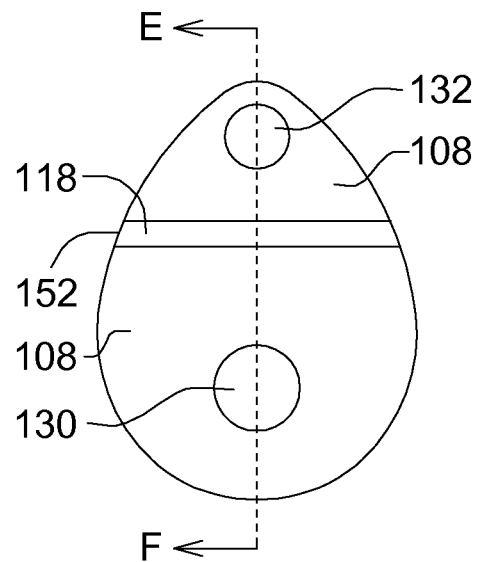
FIG. 8 illustrates a top view of a semiconductor structure according to one embodiment.

FIG. 8 illustrates a top view of the semiconductor structure according to another embodiment. For example, a cross-section view of the semiconductor structure along EF line in FIG. 8 may be similar to FIG. 6. FIG. 8 only shows first doped well 108, the second doped well 118 of the semiconductor region 152, the heavily doped region 130 and the heavily doped region 132. Referring to FIG. 8, in this embodiment, the semiconductor structure has a profile, comprising a goose shape. However, the present disclosure is not limited thereto. In other embodiments, the profile may have an ellipse shape, an oblate shape, a circle shape, etc.

Figure 9:
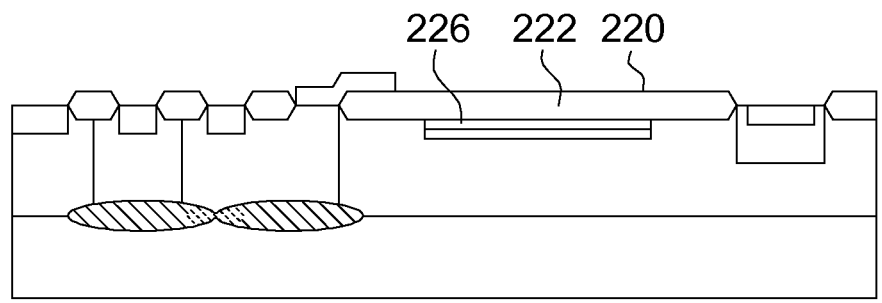
FIG. 9 illustrates a cross-section view of a semiconductor structure according to one embodiment.

FIG. 9 illustrates a cross-section view of the semiconductor structure according to one embodiment. The semiconductor structure as shown in FIG. 9 differs from the semiconductor structure as shown in FIG. 6 in that, the dielectric structure 220 comprises the dielectric portion 222 on the second top doped layer 226. A top view of the semiconductor structure as show in FIG. 9 may be similar to FIG. 7 or FIG. 8.

FIG. 10 illustrates a cross-section view of the semiconductor structure according to one embodiment. The semiconductor structure as shown in FIG. 10 differs from the semiconductor structure as shown in FIG. 6 in that the doped buried region 312 has lower-dopant-concentration regions 314 and higher-dopant-concentration regions 316.

Figure 11:
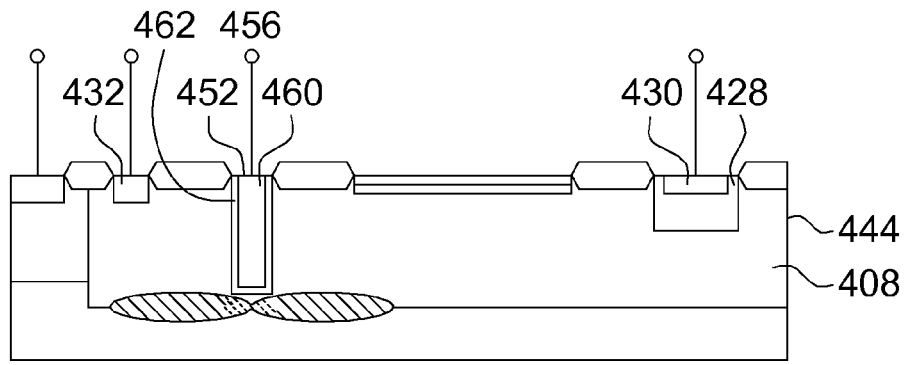
FIG. 11 illustrates a cross-section view of a semiconductor structure according to one embodiment.

FIG. 11 illustrates a cross-section view of the semiconductor structure according to one embodiment. The semiconductor structure as shown in FIG. 11 differs from the semiconductor structure as shown in FIG. 6 in that the field plate structure 38 as shown in FIG. 6 is omitted. The first doped region 444 may comprise the first doped well 408, the 428, the heavily doped region 430 and the heavily doped region 432. The semiconductor region 452 is an electrode layer 460. A dielectric layer 462 is between the first doped well 408 of the first doped region 444 and the electrode layer 460. In addition, the dielectric layer 462 is on a bottom surface and a sidewall surface of the electrode layer 460.

The dielectric layer 462 may be formed by a method comprising an etching step for forming an opening, such as a deep trench, in the first doped well 408. The dielectric layer 462 is formed on a bottom surface and a sidewall surface of the opening by a deposition method such as a vapor deposition method. The dielectric layer 462 comprises an oxide or a nitride, such as silicon oxide. Next, the electrode layer 460 is formed on the dielectric layer 462 by a deposition method such as a vapor deposition method. The electrode layer 460 may comprise a silicon such as polysilicon, a metal, or other suitable materials. The gate electrode 456 is electrically connected to the electrode layer 460.

Figure 12:
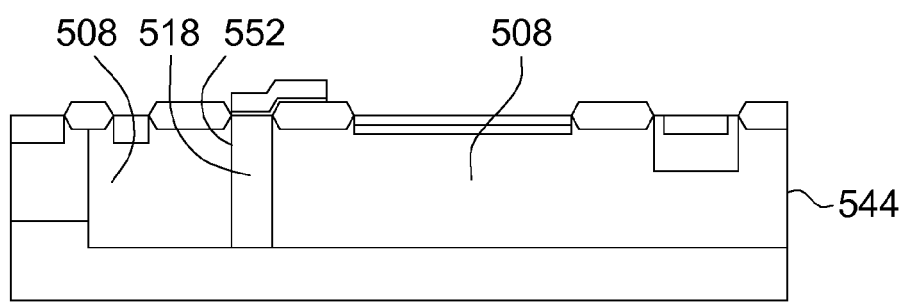
FIG. 12 illustrates a cross-section view of a semiconductor structure according to one embodiment.

FIG. 12 illustrates a cross-section view of the semiconductor structure according to one embodiment. The semiconductor structure as shown in FIG. 12 differs from the semiconductor structure as shown in FIG. 6 in that the doped buried region 12 as show in FIG. 6 is omitted. The semiconductor region 552 is a second doped region, and comprises the second doped well 518 which separates the first doped wells 508 of the first doped region 544. In this embodiment, the semiconductor structure is a MOSFET.

Figure 13:
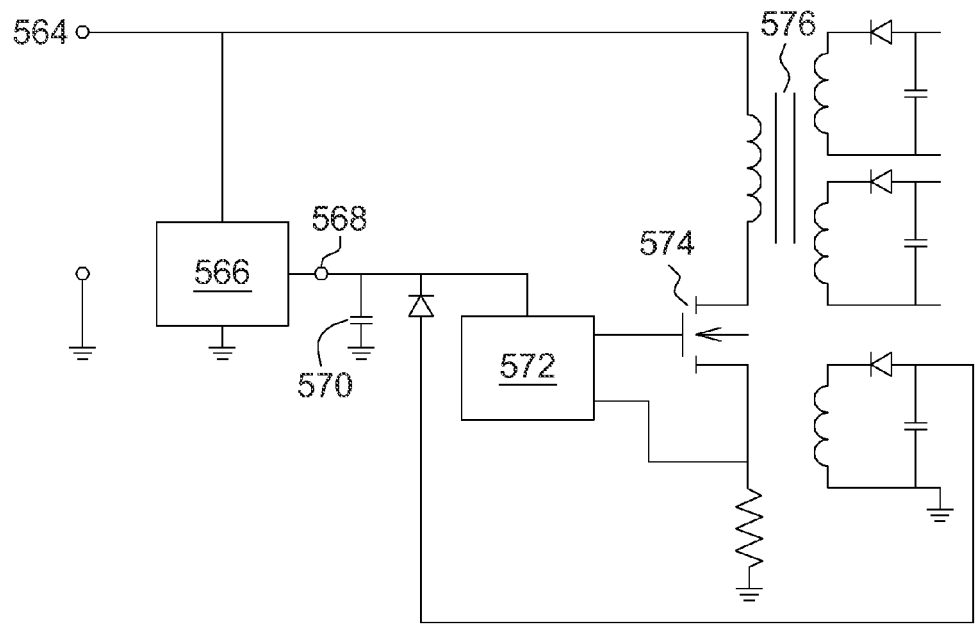
FIG. 13 illustrates a device circuit in one embodiment.
Figure 14:
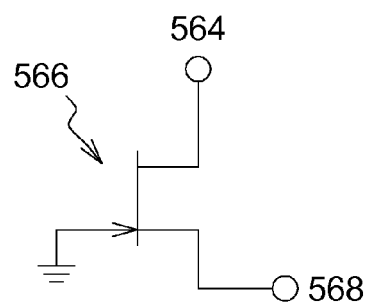
FIG. 14 illustrates a start-up circuit in one embodiment.
Figure 15:
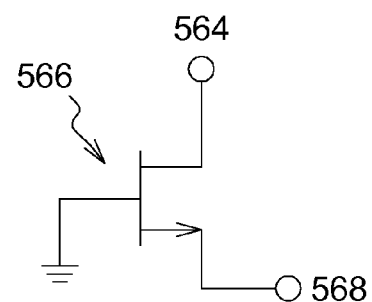
FIG. 15 illustrates a start-up circuit in one embodiment.

The semiconductor structure of embodiments can be applied to a device circuit. FIG. 13 illustrates a device circuit in one embodiment. FIG. 14 and FIG. 15 illustrate start-up circuits in various embodiments.

Referring to FIG. 13, the device circuit may be a power supply such as a switch mode power supply. During operating the device circuit, an input voltage (Vin) is provided to a first voltage terminal 564 so as to generate an output voltage (Vcc) at a voltage output terminal 568 through a start-up circuit 566 and charge a capacitor 570. As a voltage on the capacitor 570 reaches a starting voltage of a switch mode controller 572 such as pulse width modulation (PWM) circuit, the switch mode controller 572 starts to control a power switch 574 such as enhancement type MOS to work. A transformer 576 is switched by the power switch 574 so as to generate a power. After the starting step is completed, the start-up circuit 566 stops working.

Referring to FIG. 14, the start-up circuit 566 is constituted by the semiconductor structure according to the present disclosure. In this embodiment, the semiconductor structure of start-up circuit 566 is a JFET. In the embodiment as shown in FIG. 15, the semiconductor structure of the start-up circuit 566 is a MOSFET. In embodiments, the start-up circuit 566 can provide a power of 10V-30V to the switch mode controller 572 (FIG. 13).

According to embodiments of the present disclosure, the semiconductor structure has the dielectric structure and the first top doped layer and the second top doped layer of RESURF concept between the dielectric portions 22. Thus, a drain breakdown voltage of the semiconductor structure can be increased. In addition, the semiconductor structure has a channel comprising the lower-dopant-concentration region of the doped buried region. Therefore, semiconductor structure can be turned off fast with a high degree. A pinching off characteristic of the semiconductor structure is improved. Moreover, the semiconductor structure can be manufactured by a standard HV process. Thus, the cost and the processes for manufacture are reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
  a first doped region comprising first doped wells, the first doped region and the first doped wells having a first type conductivity; and
  a semiconductor region adjoined between the first doped wells and having a second type conductivity opposite to the first type conductivity, wherein a source electrode and a drain electrode are respectively electrically connected to the first doped wells on opposite sides of the semiconductor region.

2. The semiconductor structure according to claim 1, wherein the semiconductor region is a second doped region having the second type conductivity opposite to the first type conductivity.

3. The semiconductor structure according to claim 1, wherein the first doped region comprises a doped buried region having a lower-dopant-concentration region and higher-dopant-concentration regions, wherein the lower-dopant-concentration region is adjacent between the higher-dopant-concentration regions, the lower-dopant-concentration region and the higher-dopant-concentration regions have the first type conductivity.

4. The semiconductor structure according to claim 1, further comprising a third doped region having the second type conductivity opposite to the first type conductivity, wherein the semiconductor region and the third doped region are separated from each other by the first doped region.

5. The semiconductor structure according to claim 4, wherein a base electrode is electrically connected to the third doped region.

6. The semiconductor structure according to claim 4, wherein the semiconductor structure has a profile having a goose, an ellipse, a oblate or a circle shape.

7. The semiconductor structure according to claim 1, further comprising a third doped region having the second type conductivity opposite to the first type conductivity, wherein the first doped region comprises a doped buried region having a lower-dopant-concentration region and higher-dopant-concentration regions, the lower-dopant-concentration region is adjacent between the higher-dopant-concentration regions, the lower-dopant-concentration region and the higher-dopant-concentration regions having the first type conductivity, the lower-dopant-concentration region is adjacent between the semiconductor region and the third doped region.

8. The semiconductor structure according to claim 1, wherein a gate electrode is electrically connected to the semiconductor region.

9. The semiconductor structure according to claim 1, further comprising a first top doped layer having the first type conductivity and on the first doped region.

10. The semiconductor structure according to claim 9, further comprising a second top doped layer having the second type conductivity opposite to the first type conductivity and on the first top doped layer.

11. The semiconductor structure according to claim 9, further comprising a second top doped layer having the second type conductivity opposite to the first type conductivity and disposed between the first top doped layer and the first doped region.

12. The semiconductor structure according to claim 9, further comprising a dielectric structure comprising dielectric portions separated from each other, wherein the first top doped layer is on a part of the first doped region between the dielectric portions.

13. The semiconductor structure according to claim 9, further comprising a dielectric structure comprising a dielectric portion on the first top doped layer.

14. The semiconductor structure according to claim 1, further comprising a field plate structure on the semiconductor region.

15. The semiconductor structure according to claim 1, further comprising a dielectric layer between the semiconductor region and the first doped region.

16. The semiconductor structure according to claim 15, wherein the dielectric layer is on a bottom surface and a sidewall surface of the semiconductor region.

17. The semiconductor structure according to claim 15, further comprising an electrode layer, wherein the dielectric layer is between the electrode layer and the semiconductor region, a gate electrode is electrically connected to the electrode layer.

18. A semiconductor structure, comprising:
a first doped region comprising first doped wells and a doped buried region having a lower-dopant-concentration region and higher-dopant-concentration regions, wherein the lower-dopant-concentration region is adjacent between the higher-dopant-concentration regions, the first doped region, the first doped wells, the lower-dopant-concentration region and the higher-dopant-concentration regions have a first type conductivity;
a semiconductor region adjoined between the first doped wells and comprising a second doped region, the semiconductor region and the second doped region having a second type conductivity opposite to the first type conductivity; and
a third doped region having the second type conductivity, wherein the lower-dopant-concentration region is adjacent between the second doped region and the third doped region.

19. The semiconductor structure according to claim 18, wherein the semiconductor structure is a JFET, a source electrode and a drain electrode are respectively electrically connected to the first doped wells of the first doped region on opposite sides of the second doped region, a gate electrode is electrically connected to the second doped region of the semiconductor region.

20. A method for forming a semiconductor structure, comprising:
forming doped structures on a substrate, wherein the doped structures are separated from each other by a space portion, wherein the doped structures have a first type conductivity, the substrate has a second type conductivity opposite to the first type conductivity;
forming first doped wells of a first doped region and a second doped well of a semiconductor region adjoined between the first doped wells, wherein the second doped well and one of the first doped wells are on the doped structures, the first doped region and the first doped wells have the first type conductivity, the semiconductor region and the second doped well have the second type conductivity; and
annealing the doped structures for diffusing the doped structures toward the space portion to form a continuous doped buried region, wherein the doped buried region has a lower-dopant-concentration region and higher-dopant-concentration regions, a range of the lower-dopant-concentration region corresponds to a range of the space portion, a range of the higher-dopant-concentration regions corresponds to a range of the doped structures.

* * * * *